(12) United States Patent
Matsumoto et al.

(10) Patent No.: US 7,538,582 B2
(45) Date of Patent: May 26, 2009

(54) DRIVER CIRCUIT, TEST APPARATUS AND ADJUSTING METHOD

(75) Inventors: Naoki Matsumoto, Tokyo (JP); Takashi Sekino, Tokyo (JP); Toshiaki Awaji, Tokyo (JP)

(73) Assignee: Advantest Corporation, Tokyo (JP)

( * ) Notice: Subject to any disclaimer, the term of this patent is extended or adjusted under 35 U.S.C. 154(b) by 624 days.

(21) Appl. No.: 11/262,507

(22) Filed: Oct. 28, 2005

(65) Prior Publication Data

US 2007/0103198 A1    May 10, 2007

(51) Int. Cl.
*H03K 19/094*    (2006.01)
(52) U.S. Cl. .......................................... 326/82; 326/21
(58) Field of Classification Search ................ 326/21, 326/26, 27, 30, 82–86
See application file for complete search history.

(56) References Cited

U.S. PATENT DOCUMENTS

| 7,348,913 | B2 * | 3/2008 | Kawabata ................... 341/148 |
| 7,394,328 | B2 * | 7/2008 | Watanabe et al. ............ 331/172 |
| 2007/0280384 | A1 * | 12/2007 | Hidaka ........................ 375/346 |

FOREIGN PATENT DOCUMENTS

| JP | 59-058943 | 4/1984 |
| JP | 4-189051 | 7/1992 |
| JP | 4-291578 | 10/1992 |
| JP | 8-242151 | 9/1996 |
| JP | 10-190747 | 7/1998 |

OTHER PUBLICATIONS

Japanese PCT International Search Report for PCT/JP2006/321333, dated Jan. 30, 2007, and English translation thereof, 14 pages.

* cited by examiner

*Primary Examiner*—Don P Le
(74) *Attorney, Agent, or Firm*—Osha • Liang LLP (57) ABSTRACT

A test apparatus for testing a device under test is provided. The test apparatus includes a test signal generating section for generating a test signal to be provided to the device under test, a driver circuit for providing the test signal to the device under test and a determination section for determining whether is good or bad of the device under test based on the output signal outputted by the device under test according to the test signal. The driver circuit includes a main driver and a sub-driver for outputting drive signals according to the test signal, respectively, a differentiating circuit for outputting a differentiated signal obtained by differentiating the drive signal outputted by the sub-driver and an adding section for providing a signal having the waveform according to the test signal which is obtained by adding the differentiated signal to the drive signal outputted by the main driver to the device under test.

13 Claims, 10 Drawing Sheets

FIG. 1

FIG. 2A    DRIVE SIGNAL

FIG. 2B    DIFFERENTIATED SIGNAL

FIG. 2C    OUTPUT SIGNAL

FIG. 2D    OUTPUT SIGNAL AT THE END OF DUT

| DRE | PAT | POINT a | POINT b | POINT c |
|---|---|---|---|---|
| L | L | VT | H | L |
| L | H | VT | H | L |
| H | L | VL | L | H |
| H | H | VH | H | H |

DRIVER CIRCUIT, TEST APPARATUS AND ADJUSTING METHOD

BACKGROUND OF THE INVENTION

1. Field of the Invention

The present invention relates to a driver circuit, a test apparatus and an adjusting method, particularly relates to a driver circuit for providing an output signal having the waveform according to an input signal to a circuit to which the driver circuit is connected, a test apparatus and an adjusting method.

2. Related Art

For a test apparatus such as a semiconductor device, it is necessary that its driver circuit for providing test signals to a device under test is speeded up in response to increasing the test rate. However, in the test apparatus, the physical length of a transmission line from the driver circuit to the device under test is long, so that test signals are faded or lost in the transmission line. Therefore, it is difficult for a test apparatus to respond to increase the test rate only by speeding up the driver circuit.

SUMMARY OF THE INVENTION

Thus an object of the present invention is to provide a driver circuit, a test apparatus and an adjusting method which can solve the above-described problem. This object is achieved by combining the features recited in independent claims. Then, dependent claims define further effective specific example of the present invention.

In order to solve the above-described problem, a driver circuit for providing an output signal having the waveform according to an input signal to a circuit to which the driver circuit is connected is provided in a first embodiment of the present invention. The driver circuit includes a main driver and a sub-driver for outputting drive signals corresponding to a input signal, respectively, a differentiating circuit for outputting a differentiated signal obtained by differentiating the drive signal outputted from the sub-driver, and an adding section for outputting the output signal by adding the differentiated signal to the drive signal outputted from the main driver.

The driver circuit may further include a delay circuit for delaying the input signal inputted to the main driver to match the phases between the drive signal and the differentiated signal.

The power consumption of the sub-driver may be less than that of the main driver.

The adding section may have a multiplier for compensating the amplitude of the differentiated signal by multiplying the differentiated signal by a predetermined complemented value and an adder for outputting an output signal obtained by adding the differentiated signal compensated by the multiplier to the drive signal outputted by the main driver.

The adding section may have an adder for adding the differentiated signal to the drive signal outputted by the main driver and an amplifier having an output impedance substantially equal to a characteristic impedance of the transmission line for transmitting to the circuit to which the driver circuit is connected, for outputting the output signal obtained by amplifying the signal outputted by the adder.

In a second embodiment of the present invention, a driver circuit for providing an output signal having the waveform according to an input signal to a circuit to which the driver circuit is connected is provided. The input signal includes a plurality of bit signals indicative of logical values for each bit included in data to be provided to the circuit to which the driver circuit is connected, respectively. The driver circuit includes a main driver for converting each of the plurality of bit signals to signals having a predetermined amplitude based on each bit position of the plurality of bit signals and outputting the driver signal obtained by summing the plurality of bit signals which have been converted, a plurality of differentiating circuits provided corresponding to each of the bit signals, for outputting the differentiated signals obtained by differentiating the bit signals and an adding section for outputting the output signal obtained by adding the drive signal outputted by adding a plurality of differentiated signals outputted by the plurality of differentiating circuits to the drive signal outputted by the main driver.

The adding section may include a plurality of multipliers provided corresponding to each bit signals, for compensating the amplitude of the differentiated signal by multiplying the differentiated signals by the predetermined complemented values based on the bit positions and an adder for outputting the output signal obtained by adding a plurality of differentiated signals compensated by the plurality of multipliers to the drive signal outputted by the main driver.

In a third embodiment of the present invention, a driver circuit for providing an output signal having the waveform according to an input signal to a circuit to which the driver circuit is connected is provided. The driver circuit includes a main driver for outputting a drive signal according to an input signal, a plurality of differentiating circuits having difference time constants each other, for outputting a plurality of differentiated signals obtained by differentiating the input signals, respectively and an adding section for outputting the output signal obtained by adding the plurality of differentiated signals outputted by the plurality of differentiating circuits to the drive signal outputted by the main driver.

The adding section may have a plurality of multipliers for compensating the amplitude of the differentiated signals by multiplying the differentiated signals outputted by the differentiating circuits by the predetermined compensated values corresponding to the differentiating circuits and an adder for outputting the output signal obtained by adding a plurality of differentiated signals compensated by the plurality of multipliers to the drive signal outputted by the main driver.

In a fourth embodiment of the present invention, a test apparatus for testing a device under test is provided. The test apparatus includes a test signal generating section for generating a test signal to be provided to a device under test, a driver circuit for providing the test signal to the device under test and a determination section for determining whether is good or bad of the device under test based on the output signal outputted by the device under test according to the test signal. The driver circuit has a main driver and a sub-driver for outputting drive signals corresponding to a test signal, respectively, a differentiating circuit for outputting a differentiated signal obtained by differentiating the drive signal outputted from the sub-driver, and an adding section for providing a signal having the waveform according to the test signal which is obtained by adding the differentiated signal to the drive signal outputted from the main driver.

In a fifth embodiment of the present invention, a test apparatus for testing a device under test is provided. The test apparatus includes a test signal generating section for generating a test signal to be provided to a device under test, a driver circuit for providing the test signal to the device under test and a determination section for determining whether is good or bad of the device under test based on the output signal outputted by the device under test according to the test signal. The test signal includes a plurality of bit signals indicative of logical values for each bit included in data to be provided to the device under test. The driver circuit has a main driver for converting each of the plurality of bit signals to signals having a predetermined amplitude based on the bit positions and outputting a drive signal obtained by summing a plurality of bit signals which have been converted, a plurality of differentiating circuits provided corresponding to each of the bit signals, for outputting differentiated signals obtained by differentiating the bit signals, an adding section for outputting an output signal obtained by adding the plurality of differentiated signals outputted by the plurality of differentiating circuits to the drive signal outputted by the main driver.

In a sixth embodiment of the present invention, a test apparatus for testing a device under test is provided. The test apparatus includes a test signal generating section for generating a test signal to be provided to a device under test, a driver circuit for providing the test signal to the device under test and a determination section for determining whether is good or bad of the device under test based on the output signal outputted by the device under test according to the test signal. The driver circuit has a main driver for outputting a drive signal corresponding to the test signal, a plurality of differentiating circuits having different time constants each other, for outputting a plurality of differentiated signals obtained by differentiating the test signal, respectively and an adding section for outputting an output signal obtained by adding a plurality of differentiated signals outputted by the plurality of differentiated signals to the drive signal outputted by the main driver.

The adding section includes a plurality of multipliers provided corresponding to each of the differentiating circuits, for compensating the amplitude of the differentiated signals by multiplying the differentiated signals outputted by the differentiating circuits by the predetermined complemented values corresponding to the differentiating circuits. When a plurality of compensated values provided to the plurality of multipliers are adjusted, the adding section further includes an acquiring section for acquiring an output signal from the end portion for connecting a circuit to which the driver circuit is connected in the transmission line for transmitting the output signal to the circuit to which the driver circuit is connected, a comparison section for comparing the output signal acquired by the acquiring section with an expected value for the output signal to be provided to the circuit to which the driver circuit is connected according to an input signal, an adjusting section for adjusting the plurality of compensated values based on the comparison result by the comparison section. The adjusting section may have a selection section for selecting each of the plurality of compensated values in descending order of the time constant of the corresponding differentiating circuit as adjusted targets, a timing setting section for causing the acquiring section to acquire the output signal at a timing after a while since the input signal is changed when the time constant of the differentiating circuit corresponding to the compensated value for the adjusted target is larger and an adjustment processing section for adjusting the compensated value such that the value for the output signal at the timing is approximately corresponded to the expected value for the output signal to be provided to the circuit to which the driver circuit is connected according to the input signal based on the comparison result by the comparison section.

In a seventh embodiment of the present invention, an adjusting method of a driver circuit for providing an output signal having the waveform according to an input signal to a circuit to which the driver circuit is connected is provided. The driver circuit includes a main driver for outputting a drive signal according to an input signal, a plurality of differentiating circuits having different time constants each other, for outputting a plurality of differentiated signals obtained by differentiating the input signal, respectively and an adding section for outputting the output signal obtained by adding a signal which is obtained by multiplying the plurality of differentiated signals outputted by the plurality of differentiating circuits by the predetermined compensated values corresponding to the differentiating circuits to the drive signal outputted by the main driver. The adjusting method includes the steps of: acquiring the output signal from the end portion for connecting the circuit to which the driver circuit is connected in the transmission line for transmitting the output signal to the circuit to which the driver circuit is connected; comparing the output signal acquired in the acquiring step with the expected value for the output signal to be provided to the circuit to which the driver circuit is connected according to the input signal; selecting each of a plurality of compensated values as adjusted targets in descending order of the time constant of the corresponding differentiating circuit; setting a timing by acquiring the output signal at a timing after a while since the input signal is changed when the time constant of the differentiating circuit corresponding to the compensated value for the adjusted target is larger in the acquiring step; and adjusting the compensated value such that the value for the output signal at the timing is approximately corresponded to the expected value for the output signal to be provided to the circuit to which the driver circuit is connected according to the input signal.

Here, all necessary features of the present invention are not listed in the summary of the invention. The sub-combinations of the features may become the invention.

DETAILED DESCRIPTION OF THE INVENTION

Hereinafter, the present invention will now be described through preferred embodiments. The embodiments do not limit the invention according to claims and all combinations of the features described in the embodiments are not necessarily essential to means for solving the problems of the invention.

Figure 1:
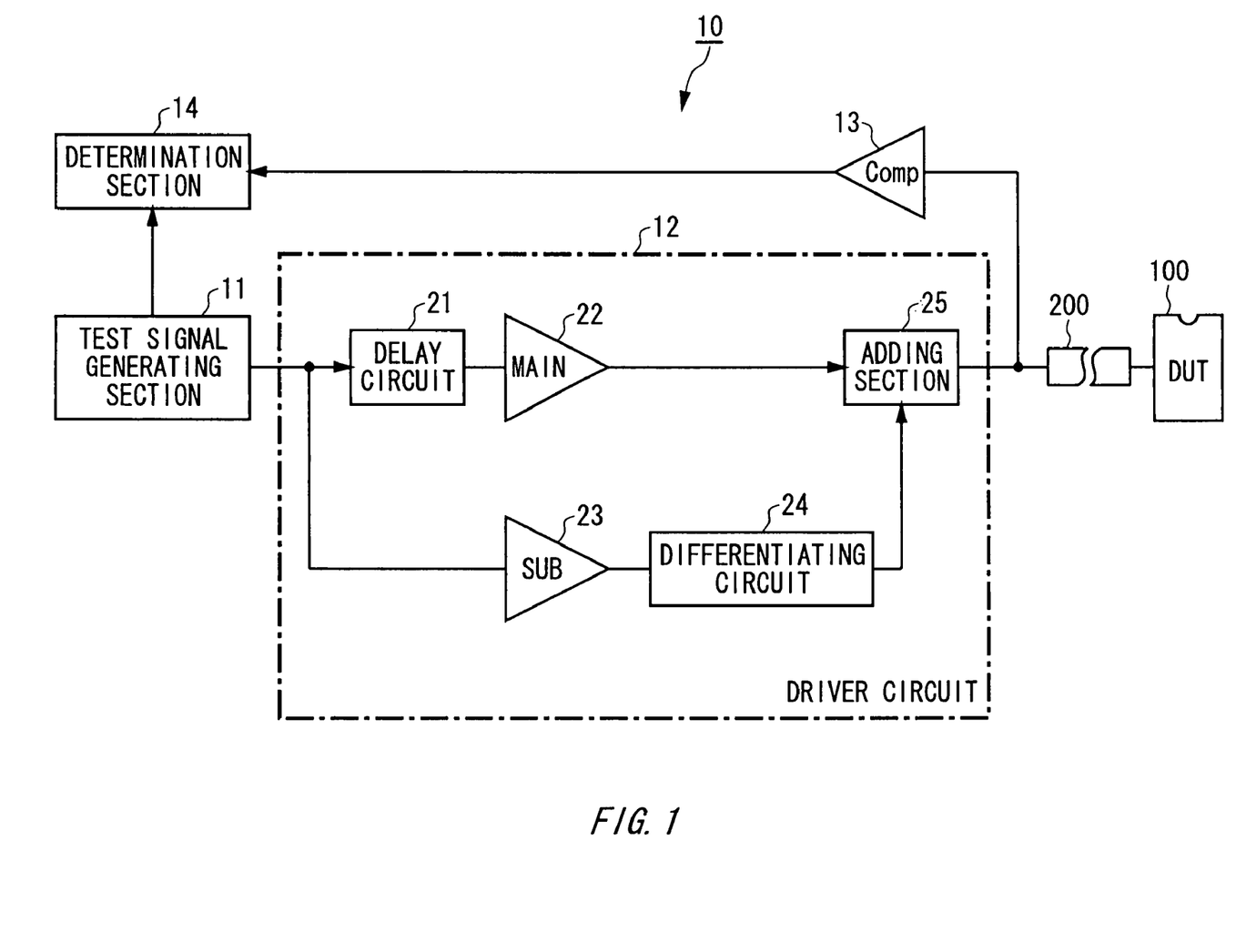
FIG. 1 shows a test apparatus 10 according to a first embodiment of the present invention.

FIG. 1 shows a test apparatus 10 according to a first embodiment. The test apparatus 10 according the present embodiment provides output signals to a device under test 100 (hereinafter referred to as a DUT 100) through a transmission line 200 and determines the output signals outputted from the DUT 100 according to the provision of the output signals to test the DUT 100. Here, the DUT 100 may be such as an electric circuit to which output signals are provided through the transmission line 200.

The test apparatus 10 includes a test signal generating section 11, a driver circuit 12, a level comparator 13 and a determination section 14.

The test signal generating section 11 generates a test signal to be provided to the DUT 100. The test signal generated by the test signal generating section 11 is inputted to the driver circuit 12. The driver circuit 12 provides an output signal having the waveform which makes the input signal correspond to the DUT 100 through the transmission line 200. The driver circuit 12 has a drive capability enough to drive the DUT 100. The signal outputted from the DUT 100 according to the provision of the output signal as a test signal is inputted to the level comparator 13 through the transmission line 200. The level comparator 13 determines the logical level of the signal. The determination section 14 compares the result of the logical level determined by the level comparator 13 with an expected value generated by the test signal determination section 11 to determine whether is good or bad of the DUT 100.

The driver circuit 12 includes a delay circuit 21, a main driver 22, a sub-driver 23, a differentiating circuit 24 and an adding section 25.

The input signal outputted from the test signal generating section 11 is inputted to the delay circuit 21. The delay circuit 21 delays the input signal in order to match the phases between a drive signal outputted from the main driver 22 and a differentiated signal outputted from the differentiating circuit 24. Specifically, the delay circuit 21 delays the input signal based on the delay time by the differentiating circuit 24.

The input signal delayed by the delay circuit 21 is inputted to the main driver 22. The main driver 22 outputs a drive signal according to the input signal. Specifically, the main driver 22 outputs a drive signal having the waveform same as the input signal or a drive signal having the waveform specified by the input signal. An input signal outputted from the test signal generating section 11 is inputted to the sub-driver 23. The sub-driver 23 outputs a drive signal according to the input signal. The sub-driver 23 is a circuit imitating the main driver 22. The sub-driver 23 has a frequency characteristic equal to that of the main driver 22 and preferably its power consumption is less than that of the main driver 22.

A drive signal outputted from the sub-driver 23 is inputted to the differentiating circuit 24. The differentiating circuit 24 outputs a differentiated signal obtained by differentiating the drive signal. The adding section 25 outputs the output signal obtained by adding the differentiated signal outputted from the differentiating circuit 24 to the drive signal outputted from the main driver 22. The output signal outputted from the adding section 25 is provided to the DUT 100 through the transmission 200.

FIG. 2 shows a drive signal outputted from the main driver 22, a differentiated signal outputted from the differentiating circuit 24, an output signal outputted from the adding circuit 25 and an output signal detected at the end of the DUT 100 side of the transmission line 200.

Figure 2A:
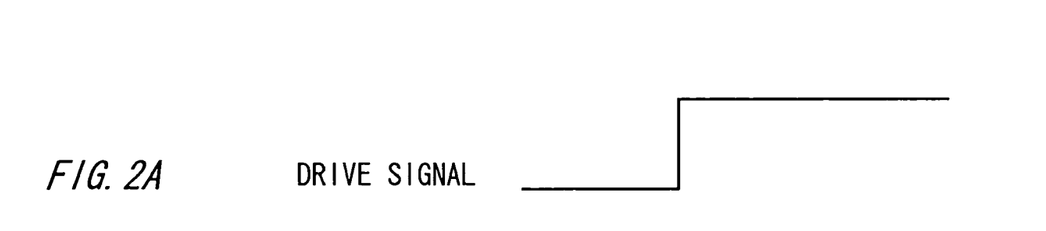
FIG. 2 shows a drive signal outputted from a main driver 22, a differentiated signal outputted from a differentiating circuit 24, an output signal outputted from an adding circuit 25 and an output signal detected at the end of a DUT 100 side of a transmission line 200.
Figures 2B, 2C:
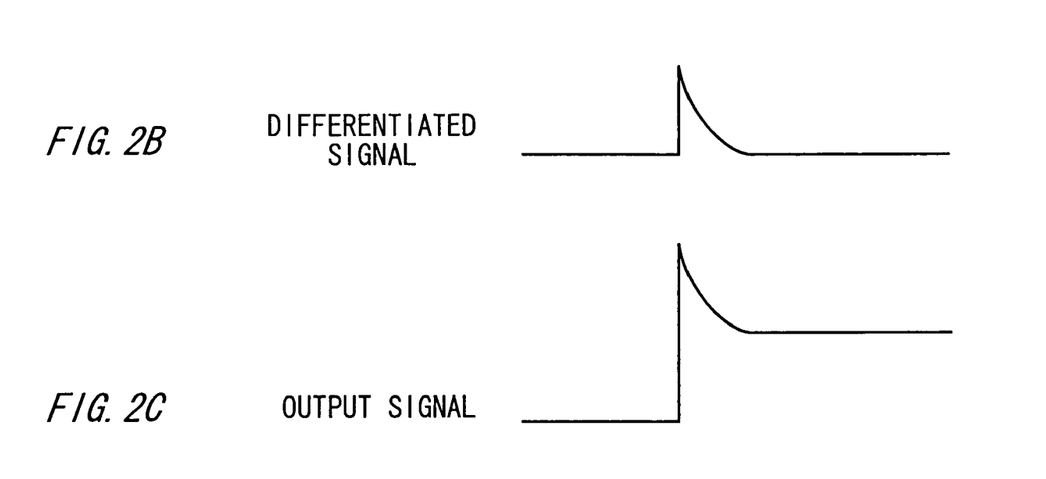

The drive signal outputted from the main driver 22 shown as (A) in FIG. 2 is provided to the adding section 25. The differentiated signal shown as (B) in FIG. 2 is a signal obtained by extracting an edge component from the drive signal and is provided to the adding section 25. The output signal shown as (C) in FIG. 2 has the waveform obtained by adding the drive signal and the differentiated signal, that is to say, the waveform is shown as the edge portion of the drive signal is enhanced.

Figure 2D:
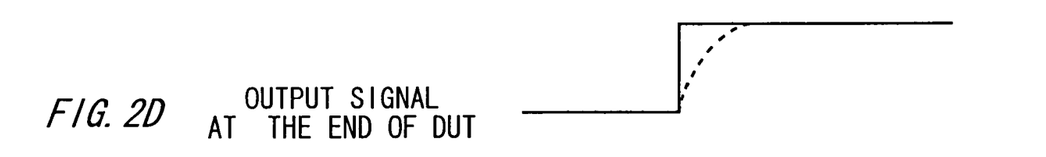

Typically, since the transmission line 200 has an integral characteristic, the output signal of which high frequency component is lost through the transmission line shown as the dotted line of (D) in FIG. 2 and then the output signal is provided to the DUT 100.

In response, the driver circuit 12 provides the output signal having the waveform showing that the edge portion of the drive signal is enhanced to compensate the loss in the transmission line. Accordingly, the driver circuit 12 can apply the output signal having the waveform same as that of the drive signal from the end of the transmission line 200 to the DUT 100 (shown as the solid line of (D) in FIG. 2).

As described above, the driver circuit 12 previously enhances the drive signal by the differentiating circuit 24 in order to compensate the high frequency component deteriorated through the transmission line 200. Thereby the driver circuit 12 can recover the signal waveforms of the end of output of the main driver 22 at the end of circuit to which the driver circuit 12 is connected and provide an appropriate signal to the circuit to which the driver circuit 12 is connected. Accordingly, the test apparatus 10 according to the present embodiment can appropriately test the DUT 100. Additionally, since the driver circuit 12 enhances the drive signal by the differentiated signal, the loss generated due to the time constant longer than the period of the test signal can be compensated.

Figure 3:
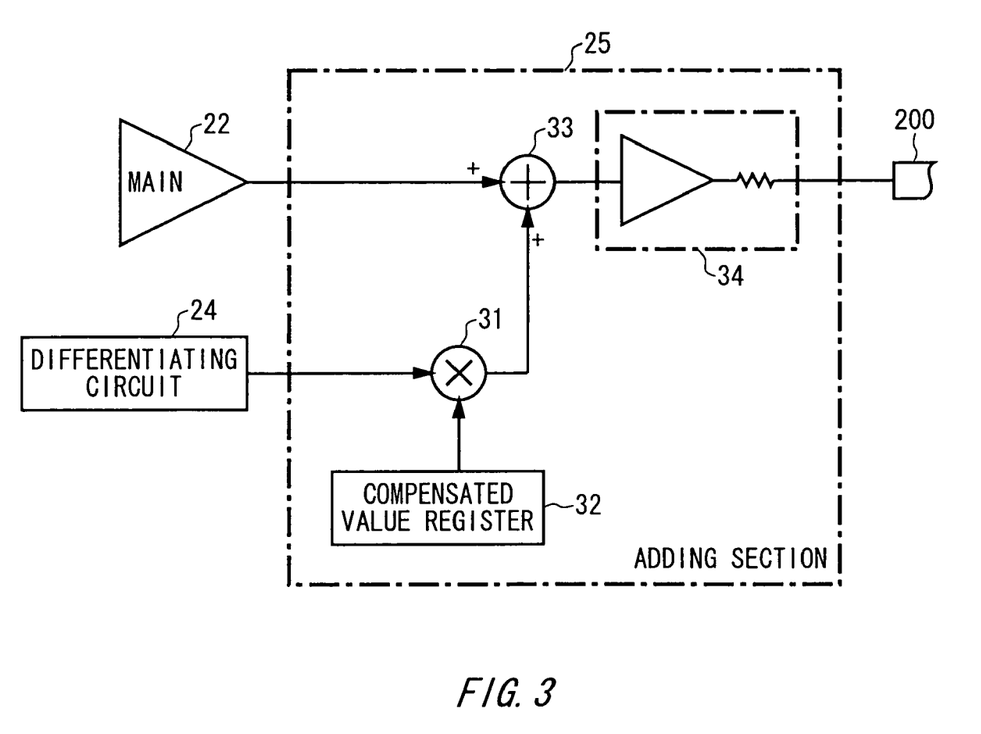
FIG. 3 shows a constitutional example of the adding section 25.

FIG. 3 shows a constitutional example of the adding section 25. The adding section 25 may include a multiplier 31, a complemented value register 32, an adder 33 and an amplifier 34.

The multiplier 31 multiplies the differentiated signal outputted from the differentiating circuit 24 by a predetermined compensated value to compensate the amplitude of the differentiated signal. The test apparatus 10 according to the present embodiment can add the appropriate differentiated signal according to the characteristic of the transmission line 200 to the drive signal by compensating the amplitude of the differentiated signal using the multiplier 31. The compensated value register 32 stores the compensated value multiplied by the multiplier 31. The adder 33 outputs the output signal obtained by adding the differentiated signal of which amplitude is compensated by the compensated value register 32 to the drive signal outputted from the main driver 22. The amplifier 34 outputs an output signal obtained by amplifying the signal outputted by the adder 33. The amplifier 34 has an output impedance substantially equal to the characteristic impedance of the transmission line 200 for transmitting to the DUT 100. Therefore, the impedance is matched between the adder 25 and the transmission line 200, so that the output signal can be provide to the DUT 100 with the minimum transmission loss.

Figure 4:
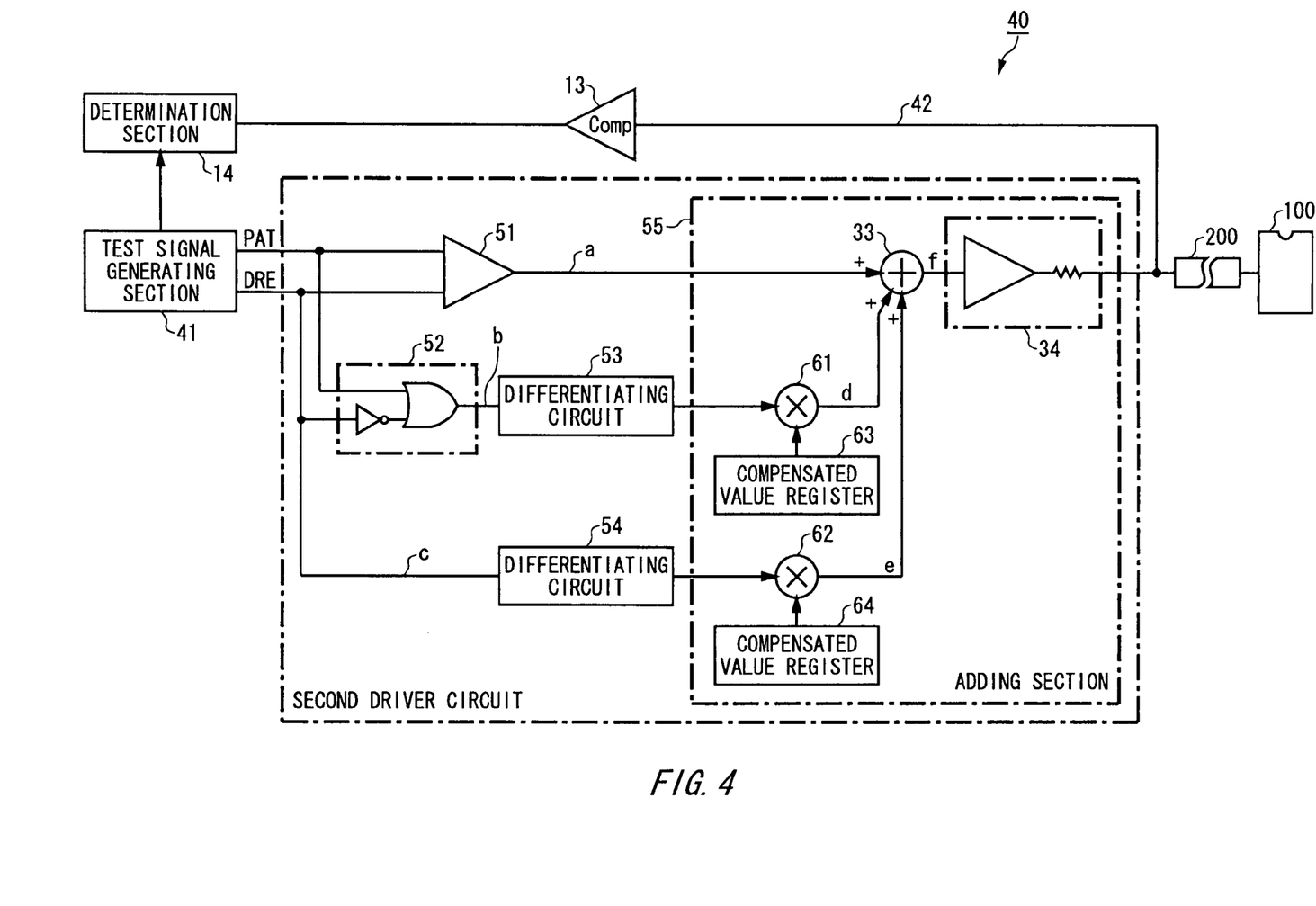
FIG. 4 shows a test apparatus 40 according to a second embodiment of the present invention.

FIG. 4 shows a test apparatus 40 according to the second embodiment. The test apparatus 40 according to the present embodiment provides multi-level output signals to the DUT 100 through the transmission line 200. Then, the test apparatus 40 determines the signal outputted from the DUT 100 according to the provision of the output signal to test the DUT 100. The members having the reference numerals same as those of the test apparatus 10 according to the first embodiment have the function and the configuration approximately equal to those of the test apparatus according to the first embodiment, so that the description is omitted except for the difference.

The test apparatus 40 includes a test signal generating section 41, a second driver circuit 42, a level comparator 13 and a determination section 14.

The test signal generating section 41 generates a test signal to be provided to the DUT 100. The test signal generated by the test signal generating section 41 includes a plurality of bit signals indicative of logical values for each bit included in the data to be provided to the DUT 100, respectively. The test signal generating section 41 generates test signals (DRE signal and PAT signal) specifying three values consisting of VL (minimum level), VH (middle level) and VT (maximum level), for example. More specifically, the test signal generating section 41 generates a test signal for specifying the VT when the DRE signal is L logic, specifying the VL when the DRE signal is H logic and the PAT signal is L logic, and specifying the VH when the DRE signal is H logic and the PAT signal is H logic.

A test signal generated by the test signal generating section 41 is inputted to the second driver circuit 42 as an input signal. The second driver circuit 42 provides an output signal having the waveform specified by the input signal to the DUT 100 through the transmission line 200. The second driver circuit 42 has a drive capability enough to drive the DUT 100.

The second driver circuit 42 includes a main driver 51, a logic circuit 52, differentiating circuits 53 and 54 and an adding section 55.

A test signal is inputted to the main driver 51 from the test signal generating section 41. The main driver 51 converts each of a plurality of bit signals into the signals having a predetermined amplitude based on the bit positions and outputs the drive signal obtained by summing the plurality of bit signals which have been converted. The main driver 51 converts the bit signals to the drive signals at a ternary level (VL, VH and VT) determined based on the logical values of bit signals included in the DRE signal and the PAT signal, for example.

The differentiating circuit 53 and 54 are provided corresponding to each of the plurality of bit signals, respectively and outputs the differentiated signals obtained by differentiating the bit signals. The differentiating circuit 53 differentiates the signal outputted from the logic circuit 52 for detecting whether the drive signal is VL to output a differentiated signal obtained by differentiating the bit signal indicative of the logical value for the first bit position, for example. The differentiating circuit 54 differentiates the DRE signal generated by the test signal generating section 41 to output a differentiated signal obtained by differentiating the bit signal indicative of the logical value for the second bit position, for example.

The adding section 55 outputs an output signal obtained by adding the differentiated signals outputted by each of the differentiating circuits 53 and 54 to the drive signal outputted by the main driver 51.

The adding section 55 may include multipliers 61 and 62 provided corresponding to each of the differentiating circuits 53 and 54, compensated value registers 63 and 64 provided corresponding to each of the multipliers 61 and 62, an adder 33 and an amplifier 34. The multipliers 61 and 62 multiply the differentiated signals outputted by the corresponding differentiating circuits 53 and 54 by the predetermined values based on the bit positions to compensate the amplitude of the differentiated signals. The compensated value registers 63 and 64 store compensated values by which the corresponding multiplies 61 and 62 are multiplied. The adder 33 outputs the output signal obtained by adding the plurality of differentiated signals compensated by the plurality of multipliers 61 and 62 to the drive signal outputted by the main driver 51.

Additionally, a delay circuit may be provided in front of the main driver 51 or the differentiating circuits 53 and 54 to match the phase with that of the adder 33 in the test apparatus 40.

Figure 5:
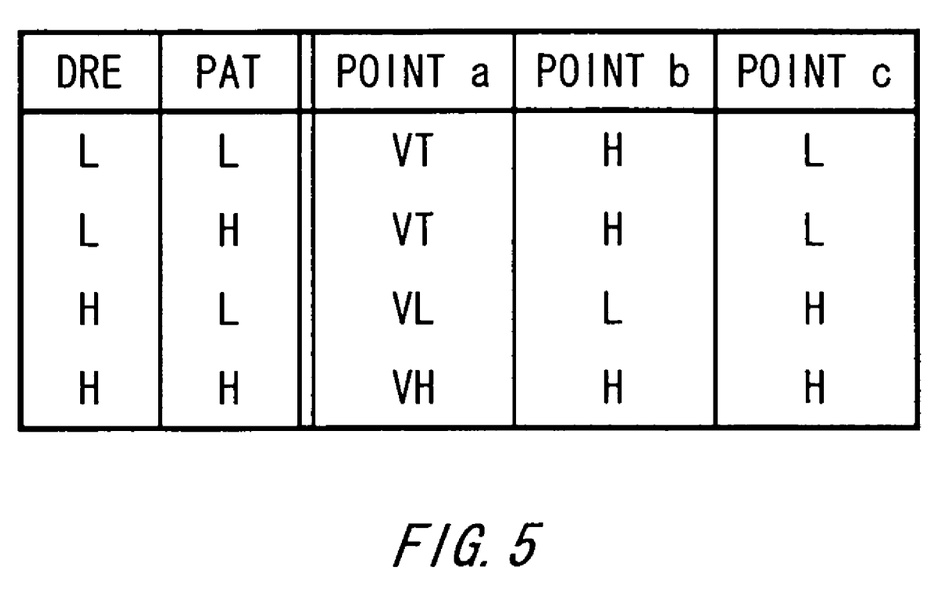
FIG. 5 is a table showing a drive signal (point a), an input value of a differentiating circuit 53 (point b) and an input value of a differentiating circuit 54 for each logical value of DRE signal and PAT signal.

FIG. 5 is a table showing a drive signal (point a), an input value of the differentiating circuit 53 (point b) and an input value of the differentiating circuit 54 for each logical value of the DRE signal and the PAT signal.

In the present embodiment, the drive signal outputted from the main driver 51 is VT when the DRE signal is L logic. Additionally, the drive signal is VL when the DRE signal is H logic and the PAT signal is L logic. Further, the drive signal is VH when the DRE signal is H logic and the PAT signal is H logic. L logic is inputted to the differentiating circuit 53 when the DRE signal is H logic and the PAT signal is L logic, and the H logic is inputted to the differentiating circuit 53 when the DRE signal is L logic, a leading and a trailing regardless of the PAT signal (point b). L logic is inputted to the differentiating circuit 54 when the drive signal is at VT, and H logic is inputted to the differentiating circuit 54 when the drive signal is at VL and VH (point C).

Figure 6:
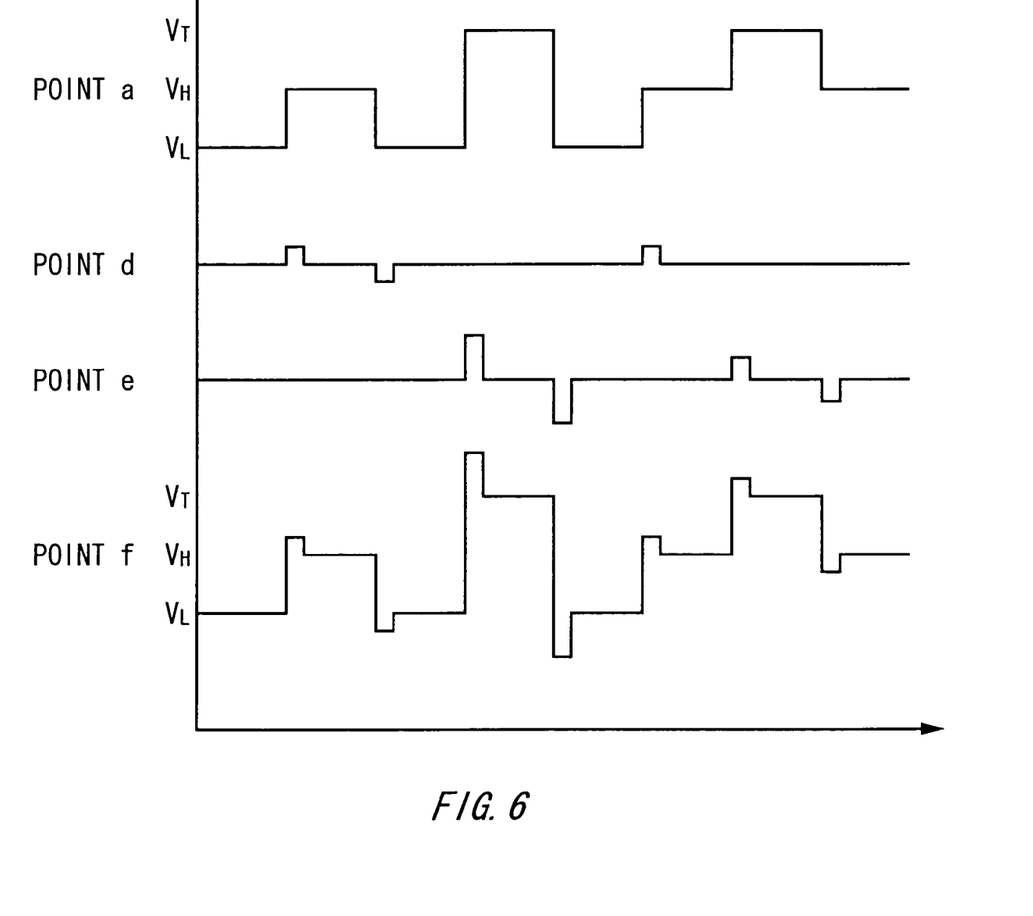
FIG. 6 shows an waveform obtained by multiplying a differentiated signal outputted from the differentiating circuit 53 by a complemented value (point d), an waveform obtained by multiplying a differentiated signal outputted from the differentiating circuit 54 by a complemented value (point e) and an waveform of an output signal outputted from the adder 33 (point f) with respect to the waveform of a drive signal (point a), respectively.

FIG. 6 shows an waveform obtained by multiplying a differentiated signal outputted from the differentiating circuit 53 by a complemented value (point d), an waveform obtained by multiplying a differentiated signal outputted from the differentiating circuit 54 by a complemented value (point e) and an waveform of an output signal outputted from the adder 33 (point f) with respect to the waveform of a drive signal outputted from the main driver 51 (point a), respectively, for example.

The level of the differentiated signal outputted from the differentiating circuit 53 is changed when the drive signal changes from VH or to VH (point d). Additionally, the differentiated signal outputted from the differentiating circuit 53 is changed when the drive signal changes from VT or to VT (point e). Further, the amplitude of the differentiated signal is corresponded to the drive signal by providing amplitude information to the compensated value registers 63 and 64. Accordingly, the waveform of the output signal is shown as the edge portion of the drive signal is enhanced with the amplitude according to the amount of changed level (point f).

As described above, since the second driver circuit 42 enhances the edge component of the drive signal, the signal waveforms of the end of output of the main driver 51 can be recovered at the end of the circuit to which the driver circuit is connected. Thereby the second driver circuit 42 can provide the appropriate signal to the circuit to which the driver circuit is connected.

Figure 7:
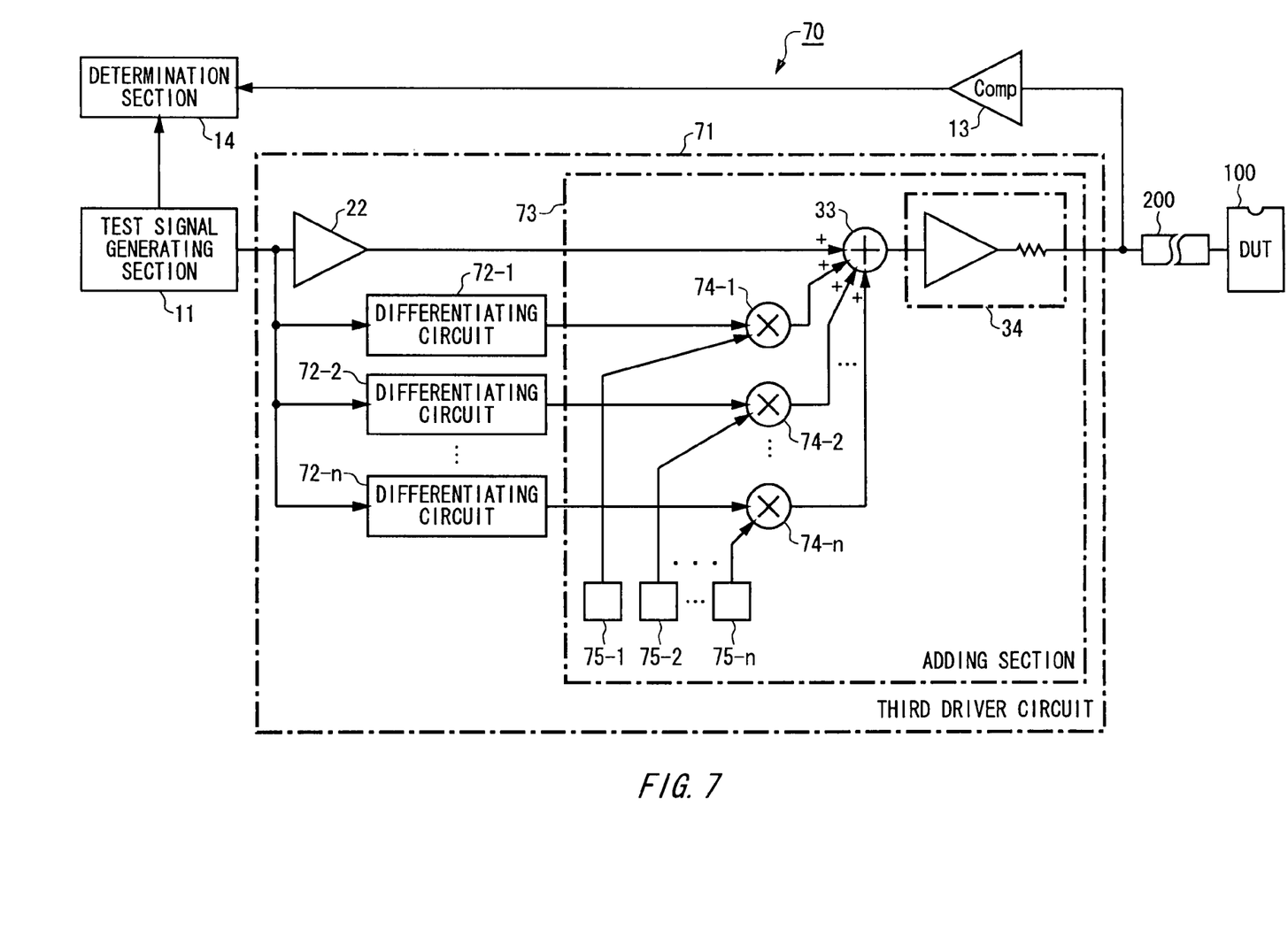
FIG. 7 shows the configuration of a test apparatus 70 according to a third embodiment.

FIG. 7 shows the configuration of a test apparatus 70 according to the third embodiment. The test apparatus 70 according to the present embodiment provides an output signal to the DUT 100 through the transmission line 200 and determines a signal outputted from the DUT 100 according to the provision of the output signal to test the DUT 100. The test apparatus 70 can test by providing the appropriate signal to the end of the circuit to which the test apparatus is connected. The members of the test apparatus 70 having the reference numerals same as those of the test apparatus 10 according to the first embodiment have the function and the configuration approximately equal to those of the test apparatus 10 according to the first embodiment, so that the description is omitted except for the difference.

The test apparatus 70 according to the present embodiment includes a test signal generating section 11, a level comparator 13, a determination section 14 and a third driver circuit 71.

A test signal generated by the test signal generating section 11 is inputted to the third driver circuit 71 as an input signal. The third driver circuit 71 provides an output signal having the waveform according to the input signal to the DUT 100 through the transmission line 200. The third driver circuit 71 has a drive capability enough to drive the DUT 100.

The driver circuit 71 has a main driver 22, a plurality of differentiating circuits 72 (72-1, 72-2, - - -, 72-n, where n is an integer equal to or more than 2) and an adding section 73.

An input signal outputted from the test signal generating section 11 is inputted to the main driver 22. The main driver 22 outputs a drive signal having the waveform according to the input signal. Input signal outputted from the test signal generating section 11 is inputted to the plurality of differentiating circuits 72. The plurality of differentiating circuits 72 output a plurality of differentiated signals obtained by differentiating the input signal, respectively. The plural differentiating circuits 72 have different time constants each other. The adding section 73 outputs the output signal by adding the differentiated signal to the drive signal outputted from the main driver 22.

The adding section 73 includes a plurality of multipliers 74 (74-1, 74-2, - - -, 74-n) provided corresponding to each of the differentiating circuits 72, compensated value registers 75 (75-1, 75-2, - - -, 75-n) provided corresponding to each of the multipliers 74, an adder 33 and an amplifier 34.

The plurality of multipliers 74 multiply the differentiated signals outputted from each of the corresponding differentiating circuits 72 by a predetermined compensated value to compensate the amplitude of the differentiated signals. The plurality of compensated value registers 75 store compensated values provided to each of the corresponding multipliers 74. The adder 33 adds the differentiated signals of which amplitude is compensated by each multiplier 74 to the drive signal outputted from the main driver 22 to output the output signal.

The test apparatus 70 adds a plurality of differentiated signals generated by the plurality of differentiating circuits 72 having the different time constants to the drive signal, so that the drive signal can be adjusted with an appropriate allocation according to the transmission line 200.

Additionally, a delay circuit may be provided in front of the main driver 22 or the plurality of differentiating circuits 72 to match between the phases of signals inputted to the adder 33.

Figure 8:
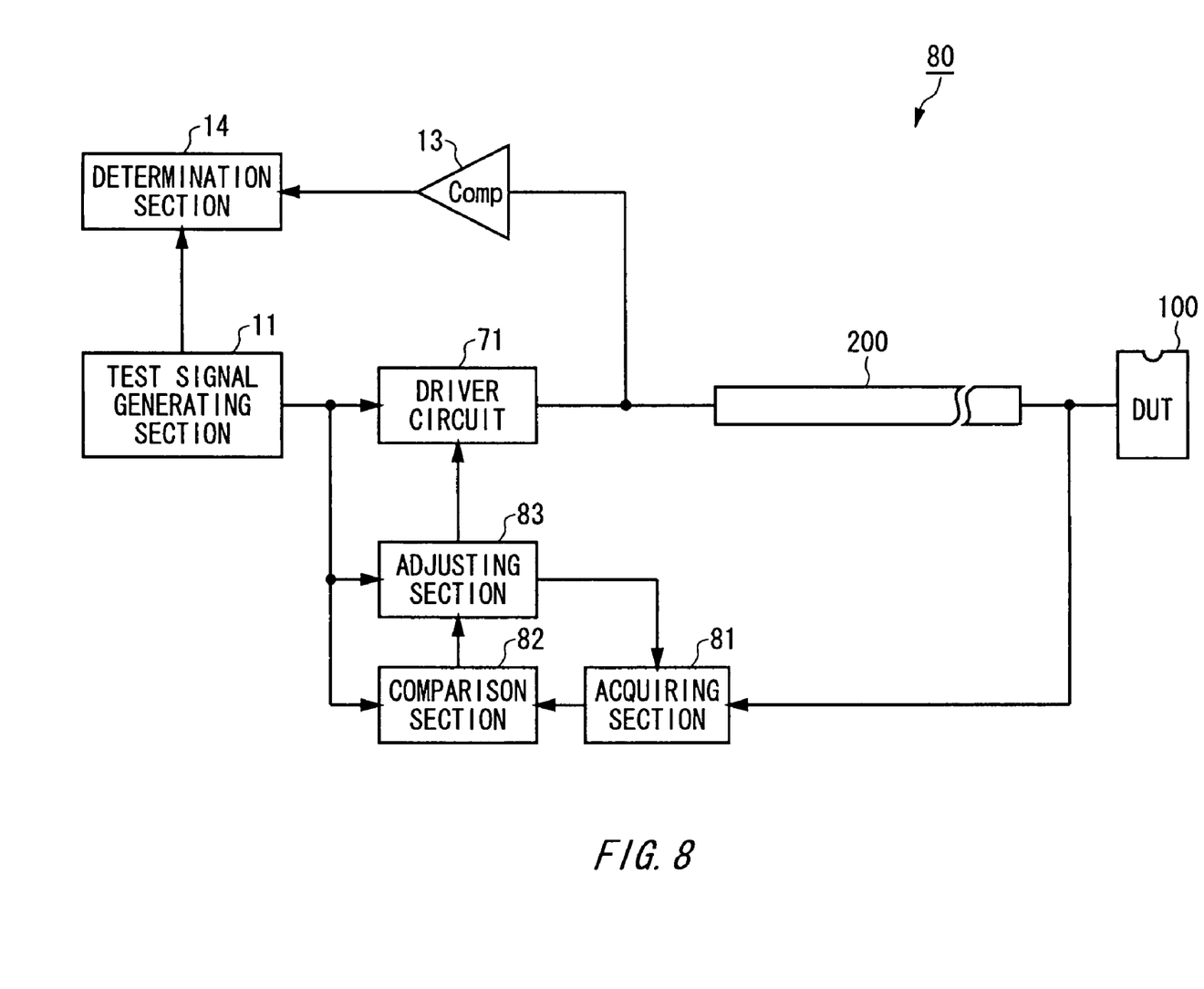
FIG. 8 shows the configuration of a test apparatus 80 according to the modification of the third embodiment.

FIG. 8 shows the configuration of a test apparatus 80 according to the modification of the third embodiment.

A test apparatus 80 according to the present modification includes an acquiring section 81, a comparison section 82 and an adjusting section 83 in addition to each circuits included in the test apparatus 70 as shown in FIG. 7 and further includes an adjustment function for adjusting compensated values provided to a plurality of multipliers 74.

To adjust a compensated value, the acquiring section 81 is connected to the DUT 100 to acquire the output signal from the end to which the DUT is connected in the transmission line 200. The comparison section 82 compares the output signal acquired by the acquiring section 81 with the expected value for the output signal to be provided to the DUT 100 according to the input signal. The adjusting section 83 adjusts a plurality of compensated values stored in a plurality of compensated value registers 75 based on the comparison result by the comparison section 82.

Figure 9:
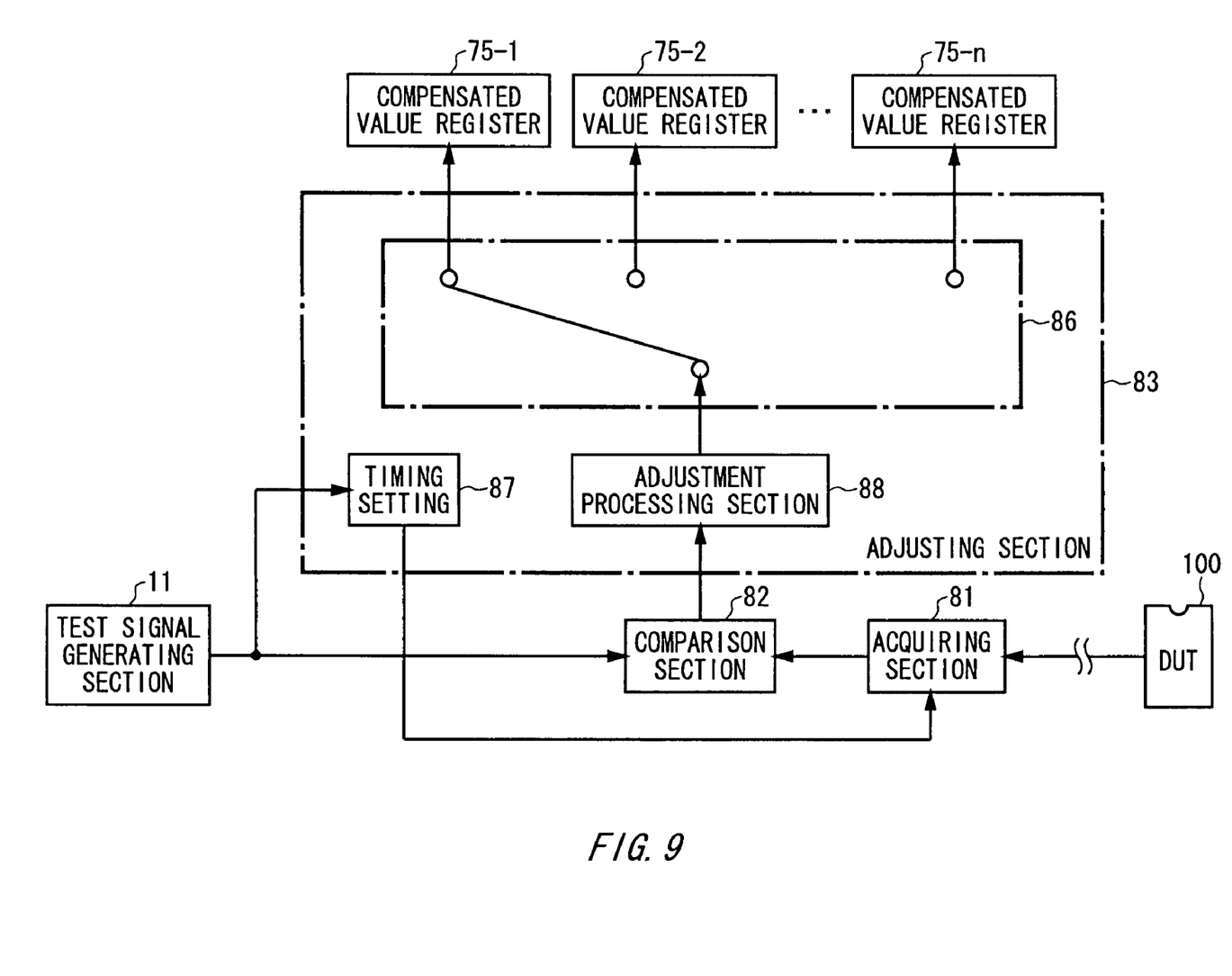
FIG. 9 shows the concrete configuration of an adjusting section 83.

FIG. 9 shows the concrete configuration of the adjusting section 83.

The adjusting section 83 has a selection section 86, a timing setting section 87 and an adjustment processing section 88.

The selection section 86 selects each of the plurality of compensated values as adjusted targets in descending order of the time constant of the corresponding differentiating circuit 72. The timing setting section 87 causes the acquiring section 81 to acquire the output signal at a timing after a while since the input signal is changed when the time constant of the differentiating circuit 72 corresponding to the compensated value for the adjusted target is larger. The adjustment processing section 88 adjusts the compensated value such that the value for the output signal at the timing is approximately corresponded to the expected value for the output signal to be provided to the DUT 100 according to the input signal based on the comparison result by the comparison section 82.

Figure 10:
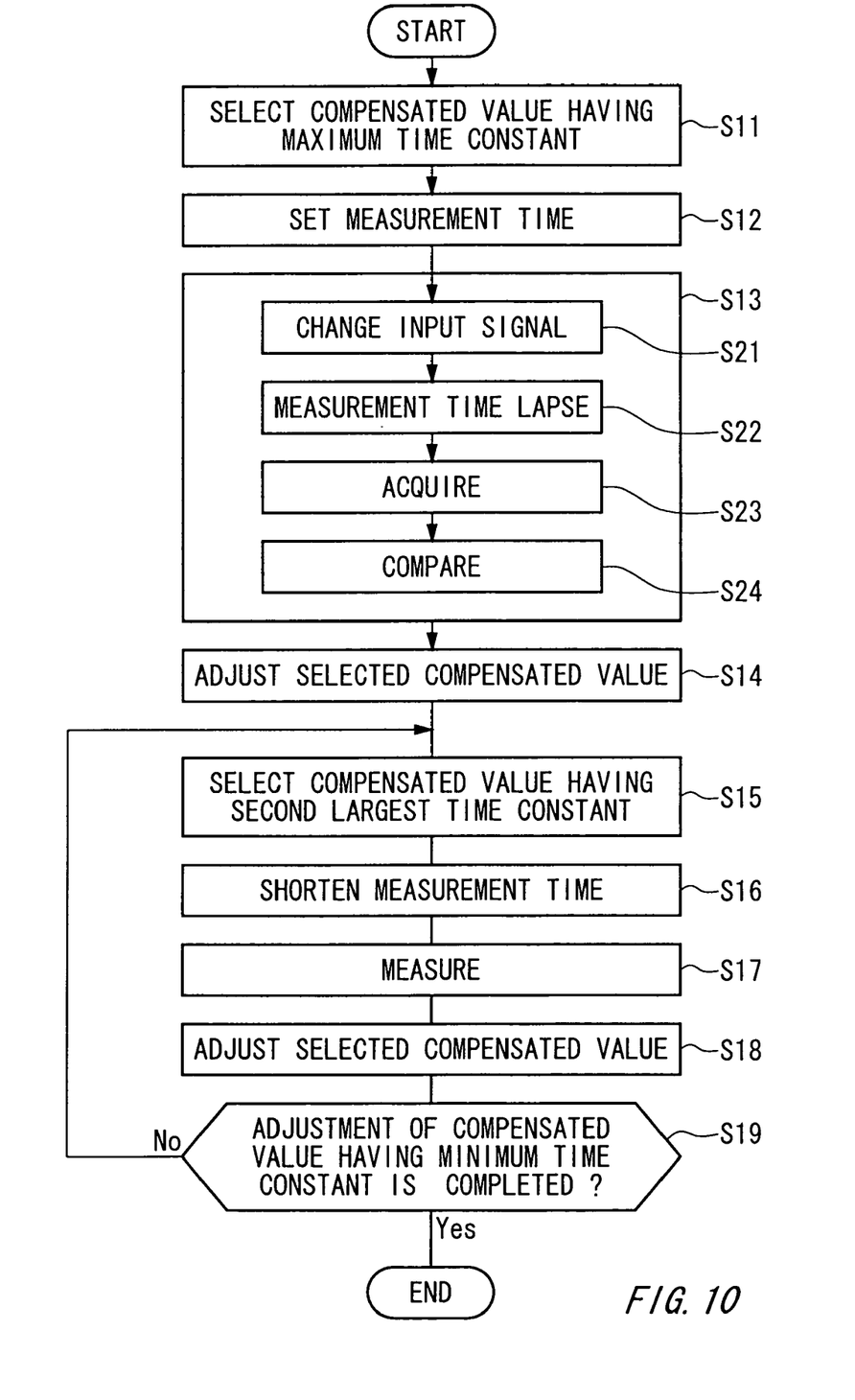
FIG. 10 is a flowchart showing an adjustment processing by the test apparatus 80 according the modification of the third embodiment.

FIG. 10 is a flowchart showing an adjustment processing by the test apparatus 80 according the present modification.

When an adjustment processing is started, firstly, the selection section 86 selects the compensated value corresponding to the differentiating circuit 72 having the maximum time constant as an adjusted target (step S11). Specifically, the selection section 86 selects one of the compensated registers 75 in which the compensated value corresponding to the differentiating circuit 72 having the maximum time constant is stored. Next, the timing setting section 87 sets a measurement time from the timing at which the amplitude of the input signal changes to the timing at which the acquiring section 81 acquires the output signal (step S12).

Next, the test apparatus 80 according to the present modification performs a measurement processing (step S13). Specifically, step S21-step S24 are performed as the measurement processing. In the test apparatus 80, the test signal generating section 11 changes the value for the input signal and the output signal according to the input signal is provided to the DUT 100 (STEP S21). Next, the timing setting section 87 issues an acquiring instruction to the acquiring section 81 at a predetermined measurement time after the timing at which the value for the input signal is changed (step S22). Next, on receiving the acquiring instruction, the acquiring section 81 acquires the output signal from the end of the DUT 100 (step S23). Next, the comparison section 82 compares the value for the output signal acquired by the acquiring section 81 with the expected value for the output signal at the same timing (step S24).

Next, after completing the measurement processing of the step S13, the adjustment processing section 88 adjusts the selected compensated value such that the value for the output signal acquired by the acquiring section 81 is approximately corresponded the expected value based on the comparison result obtained in the step S13 (step S14). Specifically, the adjustment processing section 88 changes the compensated value in the compensated value register 75 selected by the selection section 86.

Next, the selection section 86 selects the compensated value corresponding to the differentiating circuit 72 having the second largest time constant as an adjusted target (step S15). Next, the timing setting section 87 sets a measurement time from the timing at which the amplitude of the input signal is changed to the timing at which the acquiring section 81 acquires the output signal (step S16). At this time, the timing setting section 87 sets the measurement time to be shorter than the compensated value having the larger time constant which is adjusted before.

Next, the test apparatus 80 according to the present modification performs the measurement processing same as the step S13 (step S17).

Next, the adjustment processing section 88 adjusts the selected compensated value such that the value for the output signal acquired by the acquiring section 81 is approximately corresponded to the expected value (step S18).

Next, the test apparatus 80 according to the present modification determines whether the compensated value having the minimum time constant has been adjusted (step S19). Here, when the compensated value having the minimum time constant has not been adjusted, the process is repeated from the step S15, otherwise the adjusting process is completed.

As thus described above, the test apparatus 80 according to the present modification adjusts the compensated amount of the differentiating circuits 72 in descending order of time constant (the step S11 and the step S15) and adjusts the compensated value by extending the measurement time when the time constant is lager (step S22). Therefore, the test apparatus 80 preferentially adjusts the compensated value affecting a wider zone, so that the adjusting process can be effectively performed.

While the present invention have been described with the embodiment, the technical scope of the invention not limited to the above described embodiment. It is apparent to persons skilled in the art that various alternations and improvements can be added to the above-described embodiment. It is apparent from the scope of the claims that the embodiment added such alternation or improvements can be included in the technical scope of the invention.

According to the present invention as thus described above, a driver circuit for providing the appropriate signal to the end of the circuit to which the driver circuit is connected, a test apparatus and an adjusting method can be provided.

What is claimed is:

1. A driver circuit for providing an output signal having a waveform according to an input signal inputted to a circuit to which the driver circuit is connected, comprising:
   a main driver and a sub-driver for outputting drive signals according to the input signal, respectively;
   a differentiating circuit for outputting a differentiated signal obtained by differentiating the drive signal outputted by the sub-driver; and
   an adding section, including:
       a multiplier for compensating the amplitude of the differentiated signal by multiplying the differentiated signal by a predetermined compensated value; and
       an adder for outputting the output signal obtained by adding the differentiated signal compensated by the multiplier to the drive signal outputted by the main driver.

2. The driver circuit according to claim 1, further comprising a delay circuit for delaying the input signal inputted to the main driver to match the phases between the drive signal outputted by the main driver and the differentiated signal.

3. The driver circuit according to claim 1, wherein the power consumption of the sub-driver is less than the power consumption of the main driver.

4. A driver circuit for providing an output signal having a waveform according to an input signal inputted to a circuit to which the driver circuit is connected, comprising:
   a main driver and a sub-driver for outputting drive signals according to the input signal, respectively;
   a differentiating circuit for outputting a differentiated signal obtained by differentiating the drive signal outputted by the sub-driver; and
   an adding section, including:
       an adder for adding the differentiated signal to the drive signal outputted by the main driver; and
       an amplifier having an output impedance substantially equal to a characteristic impedance of a transmission line for transmitting to a circuit to which the driver circuit is connected, for outputting the output signal obtained by amplifying a signal outputted by the adder.

5. The driver circuit according to claim 4, further comprising a delay circuit for delaying the input signal inputted to the main driver to match the phases between the drive signal outputted by the main driver and the differentiated signal.

6. The driver circuit according to claim 4, wherein the power consumption of the sub-driver is less than the power consumption of the main driver.

7. A driver circuit for providing an output signal having a waveform according to an input signal inputted to a circuit to which the driver circuit is connected, the input signal including a plurality of bit signals indicative of logical values for each bit included in data to be provided to the circuit to which the driver circuit is connected, comprising:
   a main driver for converting each of the plurality of bit signals to converted bit signals having a predetermined amplitude based on each bit position and outputting the drive signal obtained by summing the plurality of converted bit signals;
   a plurality of differentiating circuits provided corresponding to each of the bit signals, for outputting differentiated signals obtained by differentiating the bit signals; and
   an adding section, including:
       a plurality of multipliers provided corresponding to each of the bit signals, for compensating the amplitude of the differentiated signals by amplifying the differentiated signals by predetermined compensated values based on the bit positions; and
       an adder for outputting the output signal obtained by adding the plurality of differentiated signals compensated by the plurality of multipliers to the drive signal outputted by the main driver.

8. A driver circuit for providing an output signal having a waveform according to an input signal inputted to a circuit to which the driver circuit is connected, comprising:
   a main driver for outputting a drive signal according to the input signal;
   a plurality of differentiating circuits having different time constants from each other, for outputting a plurality of differentiated signals obtained by differentiating the input signal, respectively; and
   an adding section, including:
       a plurality of multipliers provided corresponding to each of the differentiating circuits, for compensating the amplitude of the differentiated signals by multiplying the differentiated signals outputted by the differentiating circuits by predetermined compensated values corresponding to the differentiating circuits; and an adder for outputting the output signal obtained by adding the plurality of differentiated signals compensated by the plurality of multipliers to the drive signal outputted by the main driver.

9. A test apparatus for testing a device under test, comprising:
a test signal generating section for generating a test signal;
a driver circuit for providing a modified test signal to the device under test, including:
a main driver and a sub-driver for outputting drive signals according to the test signal, respectively;
a differentiating circuit for outputting a differentiated signal obtained by differentiating the drive signal outputted by the sub-driver; and
an adding section for providing to the device under test the modified test signal having a waveform according to the test signal, the modified test signal being obtained by adding the differentiated signal to the drive signal outputted by the main driver; and
a determination section for determining whether the device under test is good or bad based on an output signal outputted by the device under test according to the modified test signal.

10. A test apparatus for testing a device under test, comprising:
a test signal generating section for generating a test signal, the test signal including a plurality of bit signals indicative of logical values for each bit included in data to be provided to the device under test;
a driver circuit for providing a modified test signal to the device under test, including:
a main driver for converting each of the plurality of bit signals to converted bit signals having a predetermined amplitude based on each bit position and outputting a drive signal obtained by summing the plurality of converted bit signals;
a plurality of differentiating circuits provided corresponding to each of the bit signals, for outputting the differentiated signals obtained by differentiating the bit signals; and
an adding section for outputting the modified test signal obtained by adding the plurality of differentiated signals outputted by the plurality of differentiating circuits to the drive signal outputted by the main driver; and
a determination section for determining whether the device under test is good or bad based on an output signal outputted by the device under test according to the modified test signal.

11. A test apparatus for testing a device under test, comprising:
a test signal generating section for generating a test signal;
a driver circuit for providing a modified test signal to the device under test, including:
a main driver for outputting a drive signal according to the test signal;
a plurality of differentiating circuits having different time constants from each other, for outputting a plurality of differentiated signals obtained by differentiating the test signal, respectively; and
an adding section for outputting a modified test signal obtained by adding the plurality of differentiated signals outputted by the plurality of differentiating circuits to the drive signal outputted by the main driver; and
a determination section for determining whether the device under test is good or bad based on an output signal outputted by the device under test according to the modified test signal.

12. The test apparatus according to claim 11, wherein the adding section includes:
a plurality of multipliers provided corresponding to each of the differentiating circuits, for compensating the amplitude of differentiated signals by multiplying predetermined compensated values corresponding to the differentiating circuits by the differentiated signals outputted by the differentiating circuits;
an adder for outputting the modified test signal obtained by adding the plurality of differentiated signals compensated by the plurality of differentiating multipliers to the drive signal outputted by the main driver,
an acquiring section for acquiring the modified test signal from an end portion of a transmission line that connects the transmission line to the device under test, the transmission line transmitting the modified test signal to the device under test;
a comparison section for comparing the modified test signal acquired by the acquiring section with an expected value for the modified test signal to be provided to the device under test according to the test signal; and
an adjusting section for adjusting the plurality of compensated values based on the comparison result by the comparison section, the adjusting section including:
a selection section for selecting each of the plurality of compensated values in descending order of the time constant of the corresponding differentiating circuit as an adjusted target;
a timing setting section for causing the acquiring section to acquire the modified test signal at an acquiring timing, the acquiring timing being further after the timing at which the test signal is changed when the time constant of the differentiating circuit corresponding to the compensated value for the adjusted target is larger; and
an adjustment processing section for adjusting the compensated value such that the value for the modified test signal at the acquiring timing is approximately corresponded to the expected value for the modified test signal to be provided to the device under test according to the test signal.

13. An adjusting method of a driver circuit for providing an output signal having a waveform according to an input signal to a circuit to which the driver circuit is connected,
wherein the driver circuit includes:
a main driver for outputting a drive signal according to the input signal;
a plurality of differentiating circuits having different time constants as each other, for outputting a plurality of differentiated signals obtained by differentiating the input signal, respectively;
an adding section for outputting the output signal obtained by adding to the drive signal outputted by the main driver a signal which is obtained by multiplying the plurality of differentiated signals outputted by the plurality of differentiating circuits by predetermine compensated values corresponding to the differentiating circuits,
the adjusting method comprising:

acquiring the output signal from an end portion of a transmission line that connects the transmission line to the circuit to which the driver circuit is connected, the transmission line transmitting the output signal to the circuit to which the driver circuit is connected;

comparing the output signal acquired in the acquiring step with an expected value for the output signal to be provided to the circuit to which the driver circuit is connected according to the input signal;

selecting each of the plurality of compensated values in descending order of the time constant of the corresponding differentiating circuit as an adjusted target;

setting an acquiring timing for acquiring the output signal, the acquiring timing being further after the timing at which the input signal is changed when the time constant of the differentiating circuit corresponding to the compensated value for the adjusted target is larger; and adjusting the compensated value such that the value for the output signal at the acquiring timing is approximately corresponded to the expected value for the output signal to be provided to the circuit to which the driver circuit is connected according to the input signal based on the comparison result in the comparing step.

* * * * *